United States Patent
Rincon et al.

[11] Patent Number: 5,981,370
[45] Date of Patent: Nov. 9, 1999

[54] METHOD FOR MAXIMIZING INTERCONNECTION INTEGRITY AND RELIABILITY BETWEEN INTEGRATED CIRCUITS AND EXTERNAL CONNECTIONS

[75] Inventors: Reynaldo M. Rincon; Yee Hsun U, both of Richardson, Tex.

[73] Assignee: Texas Instruments Incorporated, Dallas, Tex.

[21] Appl. No.: 08/982,203

[22] Filed: Dec. 1, 1997

[51] Int. Cl.⁶ .................................................... H01L 21/44
[52] U.S. Cl. .......................... 438/612; 438/613; 438/614; 438/615; 438/616; 438/617; 438/14; 438/15; 438/17
[58] Field of Search ................................. 438/14, 15, 17, 438/612–617

[56] References Cited

U.S. PATENT DOCUMENTS 5,597,737  1/1997  Greer et al. .................................. 437/8
5,783,868  7/1998  Galloway ................................. 257/784

*Primary Examiner*—John F. Niebling
*Assistant Examiner*—David A Zarneke
*Attorney, Agent, or Firm*—Wade James Brady III; Richard L. Donaldson

[57] ABSTRACT

A method of fabricating a semiconductor device which includes providing a shaped bond pad, preferably rectangular or oval. A cavity followed by a hill are formed in the bond pad by performing a probe test at one end portion of the bond pad. Then a ball bond is formed on the bond pad remote and spaced from the cavity. The ball bond can extend onto the hill or be spaced from the hill. The bond pad preferably has a greater length than width and the cavity, hill and ball bond are disposed successively along the length of the bond pad. The length of the bond pad in the direction normal to the cavity, the hill and the ball bond is greater than the sum of the diameter of a probe tip with which a probe test will be made on the bond pad and the diameter of the ball bond.

18 Claims, 1 Drawing Sheet

METHOD FOR MAXIMIZING INTERCONNECTION INTEGRITY AND RELIABILITY BETWEEN INTEGRATED CIRCUITS AND EXTERNAL CONNECTIONS

BACKGROUND OF THE INVENTION

FIELD OF THE INVENTION

A method of testing of semiconductor chips involves the use of probes which contact pertinent areas, generally metallic pads, on the chip and then pass a signal through the chip to determine performance characteristics and the like. This probe test takes place prior to wire bonding to these metallic pads. Existing probing techniques place probe marks in the same area in which the interconnection interface must located. These probe marks amount to an actual displacement of a portion of the pad in the form of a void or cavity at the initial location of probe impact followed by a hill of the pad material which has been displaced from the void or cavity. This type of probe contact is required because there is generally an oxide (in the case of an aluminum pad) on the pad surface which must be broken through to make good electrical connection.

As bond pads decrease in size to accommodate the continued miniaturization of semiconductor devices, especially in conjunction with ultrafine pitch bonding of 75 $\mu$m and small pad pitches, the diameters of the ends of the probe needles used for probe testing are approaching the diameters of the ball bonds themselves which will later be made to the same pads as well as the pads themselves. It follows that probe testing of the future, if conducted in the same manner as in the past, will create potential bonding failures due to the displaced pad metal (voiding) under the interconnect interface or ball bond since the amount of pad metal moved now becomes a substantial portion of the total pad metal. The displacement of the pad metal can result in non-uniform connection between the pad metal and the interconnect interface. This non-uniform connection can lead to poor reliability over the life of the packaged unit in that the connection can more readily come apart in time or that an undesirable resistance characteristic is present.

SUMMARY OF THE INVENTION

In accordance with the present invention, there is provided a bond pad arrangement, probing and bonding procedure which minimizes the problem discussed hereinabove.

Briefly, there is provided a bond pad which is preferably rectangular with a long side and a shorter side rather than square (though it should be understood that the bond pad can take other shapes in accordance with the present invention, such as, for example, oval), as is generally the case in the prior art (rectangular as opposed to square bond pads have been used in the prior art, however the probe test and the bond thereto have always both been in the central region of the pad without consideration given to the problem discussed herein) and which has a long dimension which is preferably greater than the combined diameters of the ball bond to be made and the probe tip with which a probe test will be made thereon. However, this long dimension can, under certain circumstances, be slightly less than the sum of the diameters of the ball bond and the probe tip provided the ball bond can still be made with, at most, extension over a very small part of the cavity formed and without extending over the cavity. The area used for wafer probing and wire bonding are in separate areas on the bond pad. The probing position and process are controlled such that the scrubbing action of the probe tip pushes pad metal either into the bonding area or the pad is sufficiently large such that there is still sufficient area to make the ball bond without overlapping the pushed pad metal. The bonding position is controlled so that the interconnection seals the pushed up pad metal but does not touch the trench out area created by the scrubbing action of the probe needle. In this way, the probe testing is accomplished at one end of the bond pad and the bond is made at the opposing end of the bond pad, thereby causing the bond to be made in a region of the bond pad which either has no cavity therebeneath or at most, in the case of a small misalignment, only a small portion of the cavity disposed therebeneath.

In the case of tab or gold bump bonding, the failure mechanism differs in that when the tab is heated, a great deal of pressure is placed on the front end of the tab. It is therefore undesirable to probe at the end of a tab or gold bump. Therefore, the probe and bond are applied in reverse orientation.

DESCRIPTION OF THE PREFERRED EMBODIMENT

Figure 1:
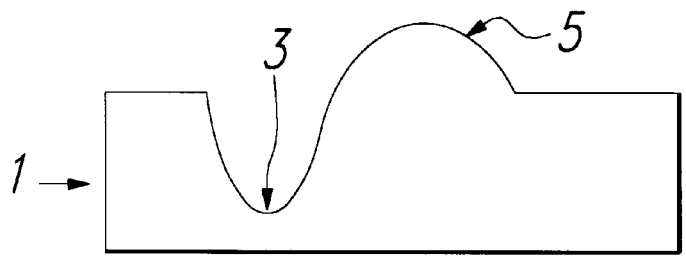
FIG. 1 is a cross sectional view of a bond pad in accordance with the prior art after it has been scrubbed by the probe needle.
Figure 2:
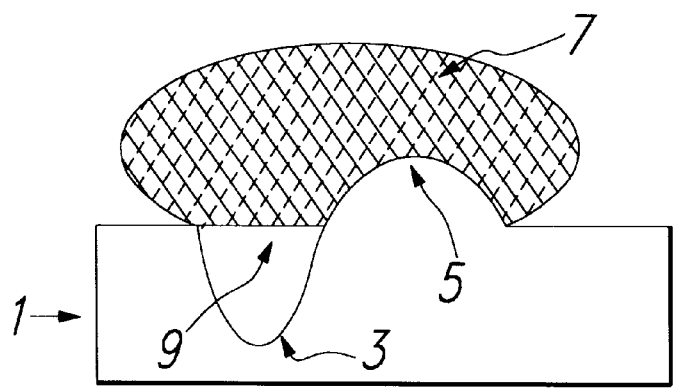
FIG. 2 is a cross sectional view of the bond pad of FIG. 1 with a ball bond thereto according to the prior art.

Referring first to FIG. 1, there is shown a cross sectional view of a bond pad 1 which has a generally square in accordance with the prior art. The bond pad 1 has undergone probe testing wherein a probe needle pierced the top portion of the pad moving from left to right and created a cavity 3 with the portion of the pad removed from the cavity creating a hill 5. Subsequently, as shown in FIG. 2, a ball bond 7 is made to the bond pad 1. Since the area used for probe testing required use of a substantial portion of the surface of the pad, the ball bond is forced to rest over the cavity 3 and the hill 5. As can be seen in FIG. 2, the ball bond 7 does not penetrate to the bottom of the cavity 3 and leaves a space 9 between the ball bond and the pad 1. Furthermore, there is the possibility that contaminants will lodge in the cavity 3 prior to the ball bonding step. This will result in a deficient electrical connection between the ball bond 7 and the pad which can cause an undesired increase in electrical resistance between the pad and the ball bond and which results in a poor physical connection that can easily come apart and cause device failure.

Figure 3:
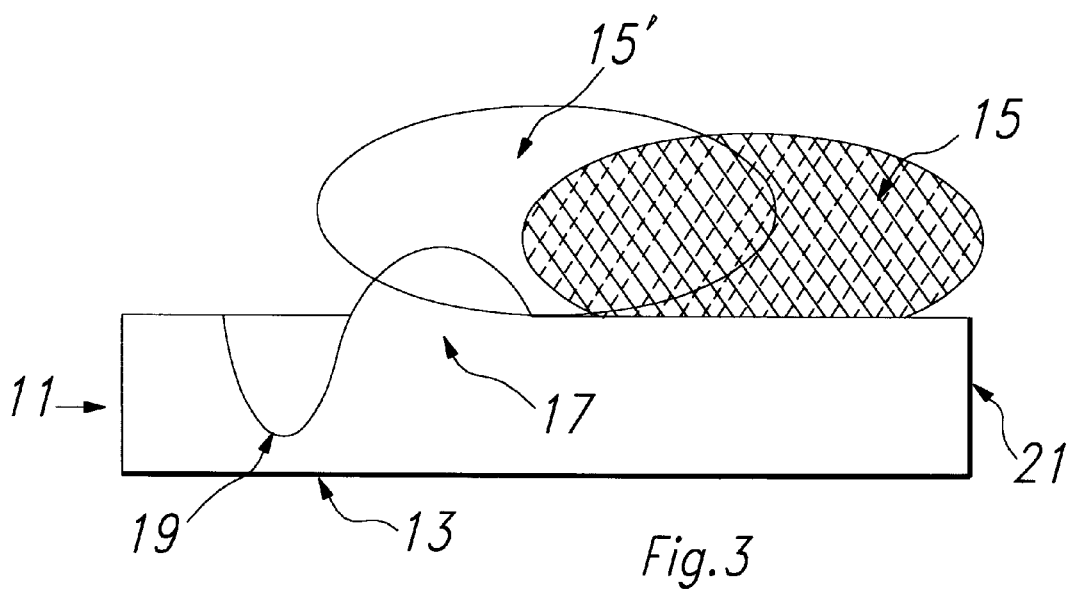
FIG. 3 is a cross sectional view of a bond pad with ball bond made thereto after probe test in accordance with the present invention.

Referring now to FIG. 3, the bond pad 11 is rectangular with the long dimension 13 of the rectangle being sufficiently long to accommodate a probe test at one end thereof and still be able to accommodate a ball bond 15 on the remaining portion of the pad. The ball bond 15' can even extend over the hill 17 without causing any electrical or mechanical problem. It therefore follows that the pad must be long enough to accommodate a probe test at one end whereby the cavity and hill are formed and have enough remaining length to accommodate a ball bond either beyond the hill or extending over the hill but preferably not over the cavity 19. It is understood that the bond pad dimensions will be minimized to the extent possible commensurate with the ability to obtain a proper probe test and ball bond.

In operation, with reference to FIG. 3, there is provided a rectangularly shaped bond pad 11 and a probe test is initially performed just inside one edge thereof and along the long dimension of the rectangle. As a result of the probe test, a cavity 19 is formed in the pad 11 with the metal displaced from the cavity providing a hill 17 alongside the cavity in the direction of the opposing edge 21 of the bond pad. Subsequently, a ball bond 15 is made to the portion of the bond pad downstream of the cavity 19 or in the direction of the opposing edge 21. The ball bond extends either beyond the cavity 19 and hill 17 as shown by the ball bond 15 or, if some misalignment takes place, over the hill 17 but not over the cavity 19.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of fabricating a semiconductor device comprising the steps of:

(a) providing a shaped bond pad;

(b) forming a cavity followed by a hill in said bond pad by performing a probe test at one end portion of said bond pad; and (c) then forming a ball bond on said bond pad remote and spaced from said cavity.

2. The method of claim 1 wherein said ball bond extends onto said hill.

3. The method of claim 1 wherein said ball bond is spaced from said hill.

4. The method of claim 1 wherein said bond pad has a greater length than width and wherein said cavity, hill and ball bond are disposed successively along said length.

5. The method of claim 2 wherein said bond pad has a greater length than width and wherein said cavity, hill and ball bond are disposed successively along said length.

6. The method of claim 3 wherein said bond pad has a greater length than width and wherein said cavity, hill and ball bond are disposed successively along said length.

7. The method of claim 1 wherein the length of said bond pad in the direction normal to said cavity, said hill and said ball bond is greater than the sum of the diameter of a probe tip with which a probe test will be made on said bond pad and the diameter of said ball bond.

8. The method of claim 2 wherein the length of said bond pad in the direction normal to said cavity, said hill and said ball bond is greater than the sum of the diameter of a probe tip with which a probe test will be made on said bond pad and the diameter of said ball bond.

9. The method of claim 3 wherein the length of said bond pad in the direction normal to said cavity, said hill and said ball bond is greater than the sum of the diameter of a probe tip with which a probe test will be made on said bond pad and the diameter of said ball bond.

10. The method of claim 4 wherein the length of said bond pad in the direction normal to said cavity, said hill and said ball bond is greater than the sum of the diameter of a probe tip with which a probe test will be made on said bond pad and the diameter of said ball bond.

11. The method of claim 5 wherein the length of said bond pad in the direction normal to said cavity, said hill and said ball bond is greater than the sum of the diameter of a probe tip with which a probe test will be made on said bond pad and the diameter of said ball bond.

12. The method of claim 6 wherein the length of said bond pad in the direction normal to said cavity, said hill and said ball bond is greater than the sum of the diameter of a probe tip with which a probe test will be made on said bond pad and the diameter of said ball bond.

13. The method of claim 1 wherein said shaped bond pad is one of rectangular oval shaped.

14. The method of claim 2 wherein said shaped bond pad one of rectangular oval shaped.

15. The method of claim 3 wherein said shaped bond pad is one of rectangular oval shaped.

16. The method of claim 4 wherein said shaped bond pad is one of rectangular oval shaped.

17. The method of claim 5 wherein said shaped bond pad is one of rectangular oval shaped.

18. The method of claim 6 wherein said shaped bond pad is one of rectangular oval shaped.

* * * * *